US010044360B2

(12) United States Patent
Kris (10) Patent No.: US 10,044,360 B2
(45) Date of Patent: Aug. 7, 2018

(54) ADC CONTROLLER WITH TEMPORAL SEPARATION

(71) Applicant: Microchip Technology Incorporated, Chandler, AZ (US)

(72) Inventor: Bryan Kris, Gilbert, AZ (US)

(73) Assignee: MICROCHIP TECHNOLOGY INCORPORATED, Chandler, AZ (US)

(*) Notice: Subject to any disclaimer, the term of this patent is extended or adjusted under 35 U.S.C. 154(b) by 0 days.

(21) Appl. No.: 15/677,909

(22) Filed: Aug. 15, 2017

(65) Prior Publication Data

US 2018/0054209 A1   Feb. 22, 2018

Related U.S. Application Data

(60) Provisional application No. 62/375,735, filed on Aug. 16, 2016.

(51) Int. Cl.
| H03M 1/10 | (2006.01) |
| H03M 1/08 | (2006.01) |
| H02J 7/00 | (2006.01) |
| H03M 1/12 | (2006.01) |
| H03M 1/60 | (2006.01) |

(52) U.S. Cl.
CPC ......... *H03M 1/0827* (2013.01); *H02J 7/0055* (2013.01); *H02J 7/0077* (2013.01); *H03M 1/1028* (2013.01); *H03M 1/1215* (2013.01); *H03M 1/1225* (2013.01); *H03M 1/60* (2013.01)

(58) Field of Classification Search
CPC ............. H03M 1/0827; H03M 1/1028; H03M 1/1215; H03M 1/60; H02J 7/0055; H02J 7/0077

USPC ......................................................... 341/144
See application file for complete search history.

(56) References Cited

U.S. PATENT DOCUMENTS

| 5,168,276 A | 12/1992 | Huston et al. ................. 341/141 |
| 7,016,069 B2* | 3/2006 | Hanagami ............ H04N 1/3871 358/1.2 |
| 7,126,515 B1 | 10/2006 | Kris .............................. 341/141 |
| 9,806,202 B2* | 10/2017 | Yamazaki .......... H01L 29/78696 |
| 2002/0018011 A1 | 2/2002 | Arai et al. ..................... 341/141 |
| 2004/0160218 A1* | 8/2004 | Chou .................... H02M 3/156 323/303 |

(Continued)

OTHER PUBLICATIONS

International Search Report and Written Opinion, PCT/US2017/047105, 13 pages, dated Nov. 21, 2017.

*Primary Examiner* — Lam T Mai (74) *Attorney, Agent, or Firm* — Slayden Grubert Beard PLLC (57) ABSTRACT

Embodiments of the present disclosure may include an ADC circuit including channel register sets, a conversion request flip-flop, a priority encoder circuit, and a controller circuit. The controller circuit may be configured to receive a conversion request signal, latch the conversion request signal into the conversion request flip-flop, determine by the priority encoder circuit a highest priority pending conversion request, and output an active channel identifier code. The channel identifier code may be configured to select the data channel register sets that are active by identifying received selection bits. The embodiments may include logic to store a converted value from a selected analog input to a data output register based on the channel identifier code.

17 Claims, 5 Drawing Sheets

(56) References Cited

U.S. PATENT DOCUMENTS

| | | | |
|---|---|---|---|
| 2005/0085806 A1* | 4/2005 | Auge, II | A61B 18/14 |
| | | | 606/32 |
| 2005/0182449 A1* | 8/2005 | Auge, II | A61B 18/14 |
| | | | 607/3 |
| 2005/0187542 A1* | 8/2005 | Auge, II | A61B 17/88 |
| | | | 606/32 |
| 2006/0064450 A1* | 3/2006 | Turner | G06F 7/48 |
| | | | 708/490 |
| 2011/0010221 A1 | 1/2011 | Horn | 705/7.42 |
| 2012/0319966 A1* | 12/2012 | Reynolds | G06F 3/041 |
| | | | 345/173 |
| 2014/0077724 A1* | 3/2014 | Sawada | H02M 3/157 |
| | | | 315/307 |
| 2016/0149055 A1* | 5/2016 | Yamazaki | H01L 27/10805 |
| | | | 257/43 |
| 2016/0218732 A1* | 7/2016 | Kim | H03M 1/124 |

* cited by examiner

ADC CONTROLLER WITH TEMPORAL SEPARATION

APPLICATION PRIORITY

This application claims priority to U.S. Provisional Patent Application No. 62/375,735 filed Aug. 16, 2016, the contents of which are incorporated herein.

TECHNICAL FIELD

The present disclosure relates to analog-to-digital converters, in particular analog-to-digital converters which may be implemented within a microcontroller with temporal separation features.

BACKGROUND

Analog-to-digital converters (ADC) are often implemented in microcontrollers and used in many applications. In particular, high speed ADCs are often used in switched mode power supply (SMPS) applications. SMPS control loops may need to acquire and process ADC measurements of analog voltages/currents very quickly. However, SMPS control loops might be interrupted while data buffers are juggled and Interrupt Service Routines (ISRs) are handled.

Measurements of multiple specific points on a signal waveform—such as a peak or a valley of such a waveform—may be made and these may be treated as distinct values. Users measuring multiple specific points on a single waveform may be required to sequentially read the ADC during a control loop cycle and manage a buffer. Embodiments of the present disclosure, in contrast, may read these distinct values and process them at one time in the associated control algorithm.

SUMMARY

Embodiments of the present disclosure may include an apparatus including an ADC circuit including channel register sets, a conversion request flip-flop, a priority encoder circuit, and a controller circuit. The controller circuit may be configured to receive a conversion request signal, latch the conversion request signal into the conversion request flip-flop, determine by the priority encoder circuit a highest priority pending conversion request, and output an active channel identifier code. The channel identifier code may be configured to select which of the plurality of data channel register sets is active by identifying received analog selection bits. The apparatus may include control logic configured to store a converted value from a selected analog input to a data output register based on the channel identifier code. In combination with any of the above embodiments, the controller circuit may include a state machine. In combination with any of the above embodiments, the conversion request flip-flop may be configured to be cleared as the conversion process is completed. In combination with any of the above embodiments, the apparatus may include a conversion request flip-flop for each channel register set. In combination with any of the above embodiments, the apparatus may include more or fewer channel register sets than analog inputs. In combination with any of the above embodiments, the channel register sets may be accessible in parallel with each other. In combination with any of the above embodiments, the channel register sets may be set before issuance of an interrupt to software allowing access to the contents therein. In combination with any of the above embodiments, the apparatus may further include connection pins, a timer, and a PWM module, wherein the conversion request signal is generated by one of the timer, the PWM module, or the device pin. In combination with any of the above embodiments, the selected analog input may be selected from a plurality of analog inputs applied to an analog input multiplexer. In combination with any of the above embodiments, the controller circuit is further configured to cause subsequent measurements from the selected analog input. In combination with any of the above embodiments, the control logic is further configured to store the subsequent measurements into a plurality of channel registers. In combination with any of the above embodiments, the apparatus further includes an interrupt handler circuit configured to generate an interrupt to software after the subsequent measurements are stored in the plurality of channel registers.

Embodiments of the present disclosure include an ADC, comprising any of the apparatuses of the embodiments above. Moreover, embodiments of the present disclosure include a microcontroller, comprising any of the apparatuses or ADCs of the embodiments above. In addition, embodiments of the present disclosure include methods performed by any of the apparatuses, ADCs, or microcontrollers described above.

DETAILED DESCRIPTION

Various embodiments of the present disclosure may be configured to take samples of a specific signal and place or "bin" the data into unique registers based on timing signals to reduce the software overhead of processing the measurement data.

ADCs are the most common peripheral in a microcontroller. SMPS applications and other demanding applications require very fast ADCs. Some microcontrollers according to some embodiments comprise a dual or multiple core architecture in which each core comprises its own ADC. Other dual or multiple core architectures comprise ADC peripheral units that are shared between the cores. According to one embodiment, a dual core device is designed particularly to target power supply applications and incorporate an ultraspeed ADC, operating as fast as 10 ns. Such an ADC is fast enough, for example, to sample an inductor current waveform at critical inflexion points. A new controller according to an embodiment for this ADC peripheral incorporates a feature called "temporal separation."

Figure 1:
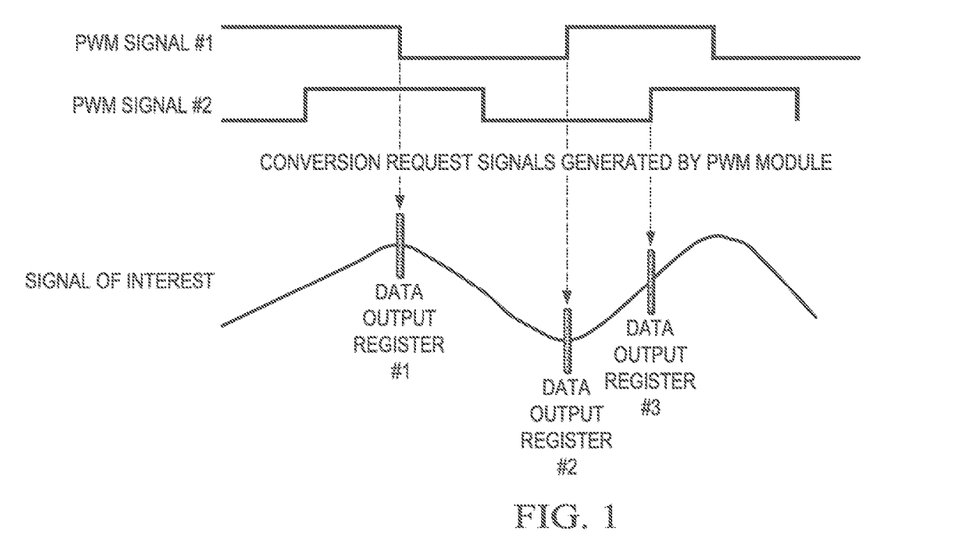
FIG. 1 is an illustration of a timing diagram of pulse width modulation (PWM) signals used to trigger an ADC conversion wherein each conversion is assigned to a different output register.

FIG. 1 shows a timing diagram of pulse width modulation signals used to trigger an ADC conversion wherein each conversion is assigned to a different output register, according to embodiments of the present disclosure. The three samples shown of the signals illustrate example inflection points of interest. A first PWM signal may generate samples to be taken upon rising or falling edges of the PWM signal, resulting in FIG. 1 with the samples output to register numbers 1 and 2. A second PWM signal may generate samples to be taken upon falling edges of the PWM signal, resulting in FIG. 2 with the sample output to register 3. In any case, the high speed of embodiments of the present disclosure may enable a controller to direct an ADC to take samples at the peak, valley, or mid-rise, for example, of a signal of interest.

Figure 2:
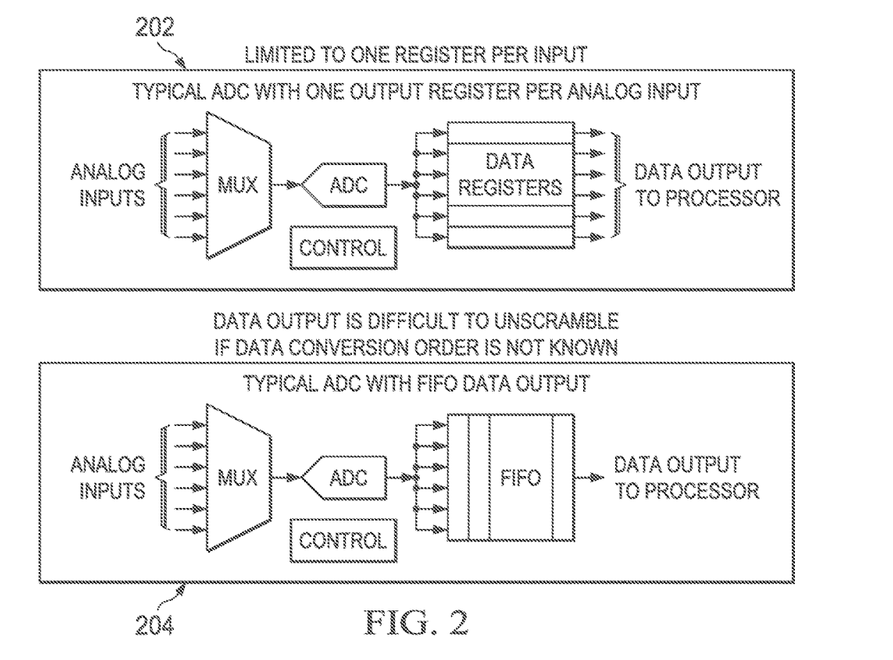
FIG. 2 is an illustration of conventional ADCs that either use single registers to store subsequent conversions.

FIG. 2 illustrates conventional ADC configuration and operation. In ADC 202, a single output register may be implemented per analog input. Given multiple analog inputs, the inputs may be multiplexed. A controller may cause the ADC to sequentially sample the analog inputs and route the analog inputs to respective output registers with the results of the A/D conversion. The individual data registers may be accessible as required by software running on a system, processor, or microcontroller. The software may access the data of a given analog input by accessing the corresponding data register. The data registers may exist with respect to the analog inputs on a 1:1 basis.

In ADC 204, a first-in-first-out (FIFO) memory may be used to output results of the A/D conversion to software running on a system, processor, or memory. However, in such a case software accessing the FIFO must fully understand and convert the data in the FIFO. Software cannot merely access the FIFO to look for a single analog input's data, as such access requires knowledge of what other conversion processes and the parameters thereof are being performed by ADC 204. For example, the number of analog inputs actively being converted and the rates thereof by the entirety of ADC 204 might need to be known in order to unscramble the output of ADC 204.

Figure 3:
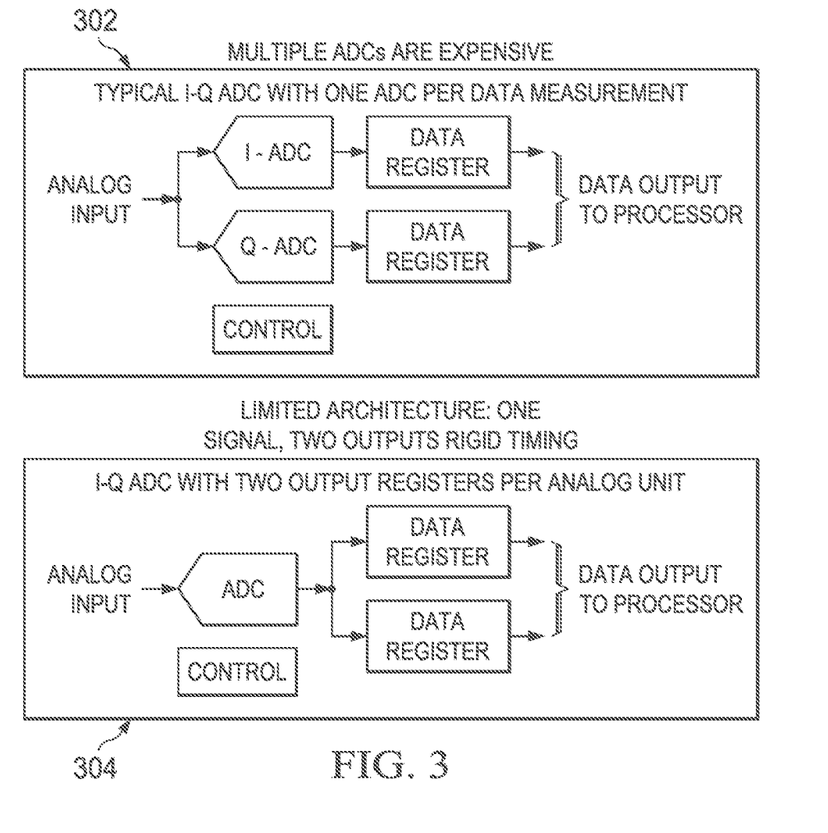
FIG. 3 is an illustration of a typical I-Q ADC.

FIG. 3 illustrates typical I-Q ADC. I-Q ADC may measure the I and Q portions of a sinusoidal signal, useful in some signal processing, wireless, and fiber optic applications. ADC 302 may be implemented using two ADCs—one each for the I part of the signal and the Q part of the signal. Each such ADC may output its value to dedicated registers. However, this solution may be expensive, as an individual ADC in 302 may require substantial die or semiconductor space, power, or cost to implement.

ADC 304 may be implemented with a single ADC to capture both the I and Q portions of the signal, each outputted to individual data registers. However, to capture both the I and Q portions of the signal, rigid timing must be enforced to correctly capture the different components.

Figure 4:
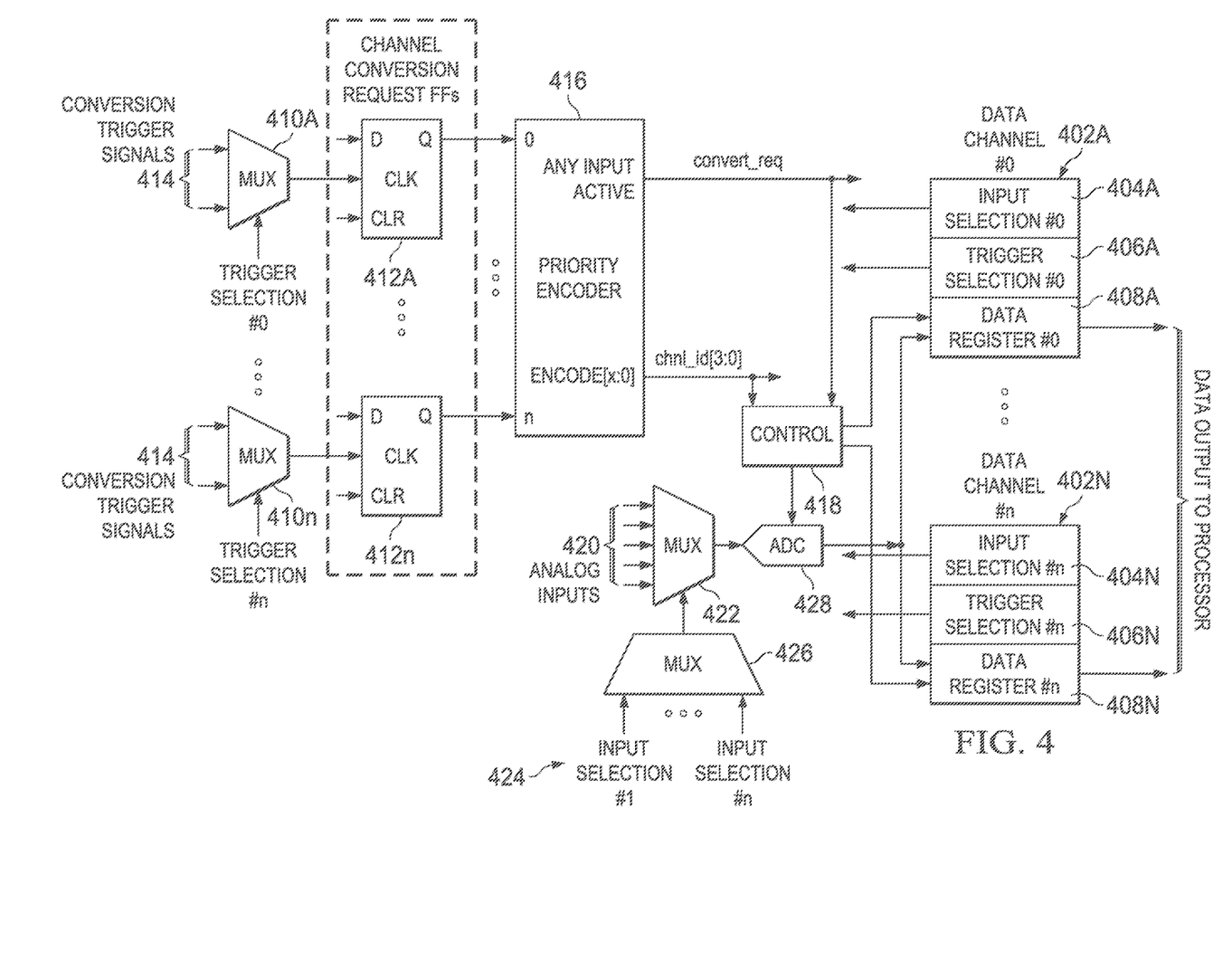
FIG. 4 is an exemplary block diagram of an ADC controller with temporal separation, according to embodiments of the present disclosure.

FIG. 4 illustrates a block diagram of an ADC 400 configured for temporal separation, according to embodiments of the present disclosure. The elements of ADC 400 may be implemented by any suitable combination of analog and digital circuitry. ADC 400 may be configured to perform ADC conversions with an ADC circuit 428 controlled by a control circuit 418, wherein the conversions are uniquely timed by conversion request or trigger signals 414.

ADC 400 may utilize data channels 402. Multiple data channels may collect data from the same or different analog signal. Conversions may be separated in time. Moreover, results of conversions may be placed into different physical locations or registers. A user of ADC 400 such as software can organize and re-organize data channels 402 to fit a particular application.

An individual data channel 402 may include an input selection register 404, a trigger selection register 406, and a data output register 408. Each data channel 402 may also include or be associated with one or more conversion request or trigger signals 414, a multiplexer 410 configured to multiplex the conversion request or trigger signals 414, and a conversion request flip-flop (FF) 412 configured to receive the multiplexed output of multiplexer 410. In the example of FIG. 4, ADC 400 may be used with ADC channels 402A-402N, though any suitable number of ADC channels may be implemented therein.

ADC 400 may also include a multiplexer 422 configured to multiplex different analog inputs 422 into ADC circuit 428. In the example of FIG. 4, particular ones of analog inputs 420 may be selected to be output from multiplexer 422 by another multiplexer 426, configured to multiplex selection signals 424. Selection signals 424 may correspond to data channels 402.

ADC 400 may include a priority encoder circuit 416. Priority encoder circuit 416 may be configured to determine the highest priority of the pending conversion requests made in conversion request signals 414. The highest priority of the pending conversion requests may be identified according to a channel identifier, identifying which of data channels 402 includes the highest priority pending conversion request. The channel may be identified in an active channel identifier code denoted as "chnl_id[x:0]".

Conversion request signals 414 may be generated by other portions of a microcontroller in which ADC 400 is implemented, or may be generated by elements or circuitry external to such a microcontroller and received by the microcontroller. For example, conversion request signals 414 may originate from timers, PWM control circuitry, or microcontroller pins. Conversion request signals 414 may be received and latched into a FF 412 associated with the trigger selection signal controlling an associated multiplexer 410. Conversion request signals 414 may be provided in parallel to each of multiplexers 410.

Conversion request signals 414 may be latched in FFs 412. Priority encoder circuit 416 may identify which of conversion request signals 414 as latched in FFs 412 are the highest priority. Priority encoder circuit 416 may output the active channel identifier code to control circuit 418. If there are any active inputs, priority encoder circuit 416 may output a signal to control circuit 418 indicating that there are pending active inputs.

When control circuit 418 receives a signal that there are pending active inputs, control circuit 418 may interpret the channel identifier received from priority encoder circuit 416 to direct routing of the corresponding analog input 420 to ADC circuit 428 to perform analog-to-digital conversion. Control circuit 418 may use the channel identifier code to select which data channel register set of data channels 402 is active and will store results of ADC. Control circuit 418 may control input selection signals 424 into multiplexer 426 to select the associated analog input 420 by multiplexer 422. Values within registers 404, 406 may be used to apply to selections 424, 410. Control circuit 418 may issue control logic to clear the associated FF 412 after conversion. The process repeats for the next pending conversion request.

ADC may be performed by ADC 400 without active control by a CPU of a microcontroller in which ADC 400 is embedded. Such a CPU may only initially program the various registers. ADC 400 may issue an interrupt once a converted value is available for further processing.

ADC circuit 428 may perform with very low sample-to-output latency, such as 10 ns. Accordingly, a user of ADC 400 may be able to sample may different points on an analog signal such as shown in FIG. 1. For example, a user may program measurements to be requested of ADC 400 at the peak and valley inductor points in a power supply provided to an analog input of ADC 400. In one embodiment, channels 402 may be digital and separated from analog inputs 420. Through such separation, a user of ADC 400 may take two different samples of a single signal, wherein the two different samples may be placed into dedicated registers. Moreover, more than two such samples of a single analog input signal may be made. ADC 400 may support collection of as many samples as can be enabled by the number of digital channels 402. The samples may be collected without interim software intervention by users of ADC 400. Software or users of ADC 400 may collect data from the registers, and subsequent collection of other samples may be unimpeded through software interrupts. A user of ADC 400 need not collect a first sample then reissue a request for a second sample. The ability to sample multiple parts of a single analog input may be referred to as temporal separation.

Figure 5A:
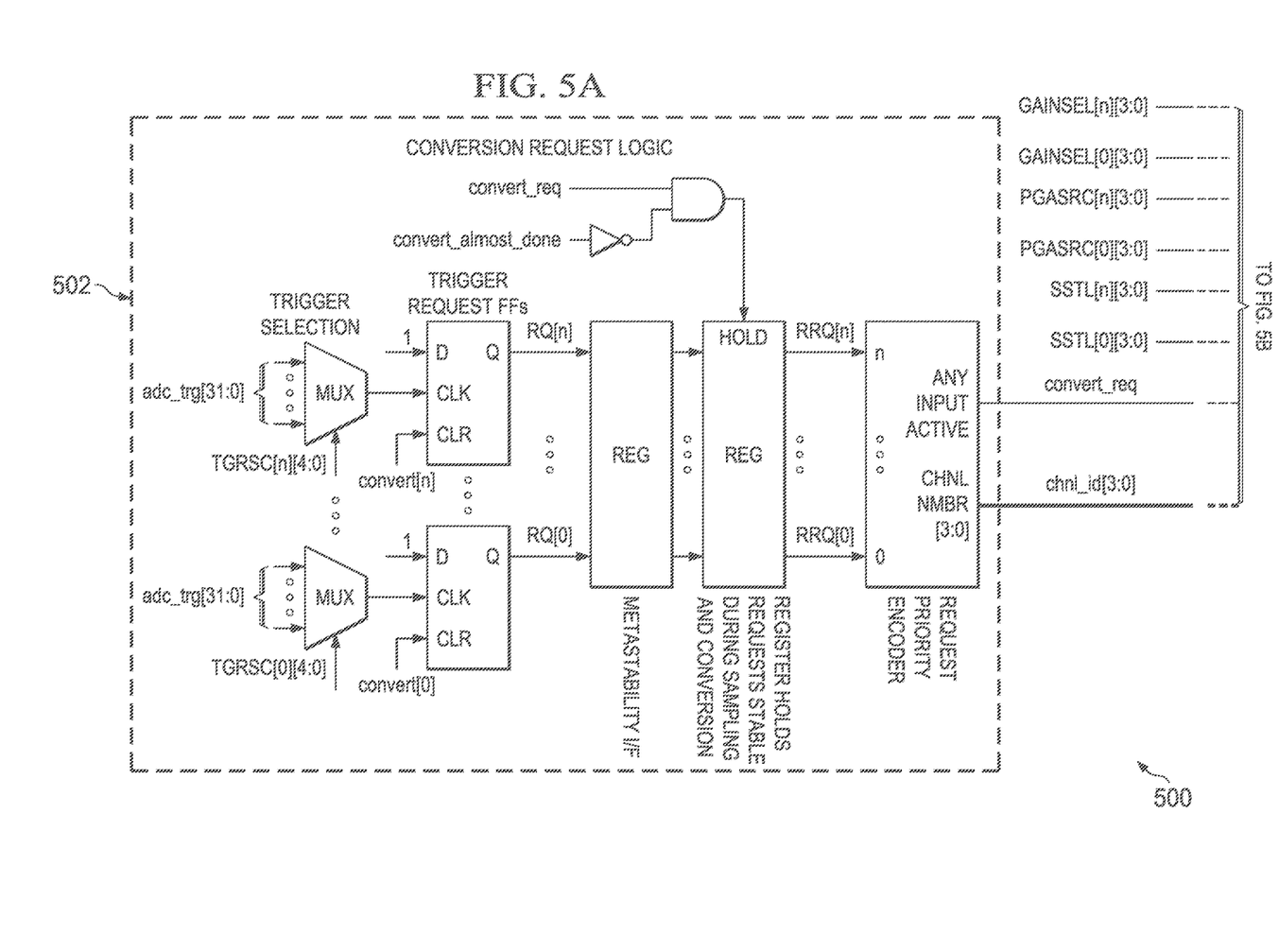
FIGS. 5A-5B are a more detailed exemplary block diagram of an ADC controller with temporal separation, according to embodiments of the present disclosure.
Figure 5B:
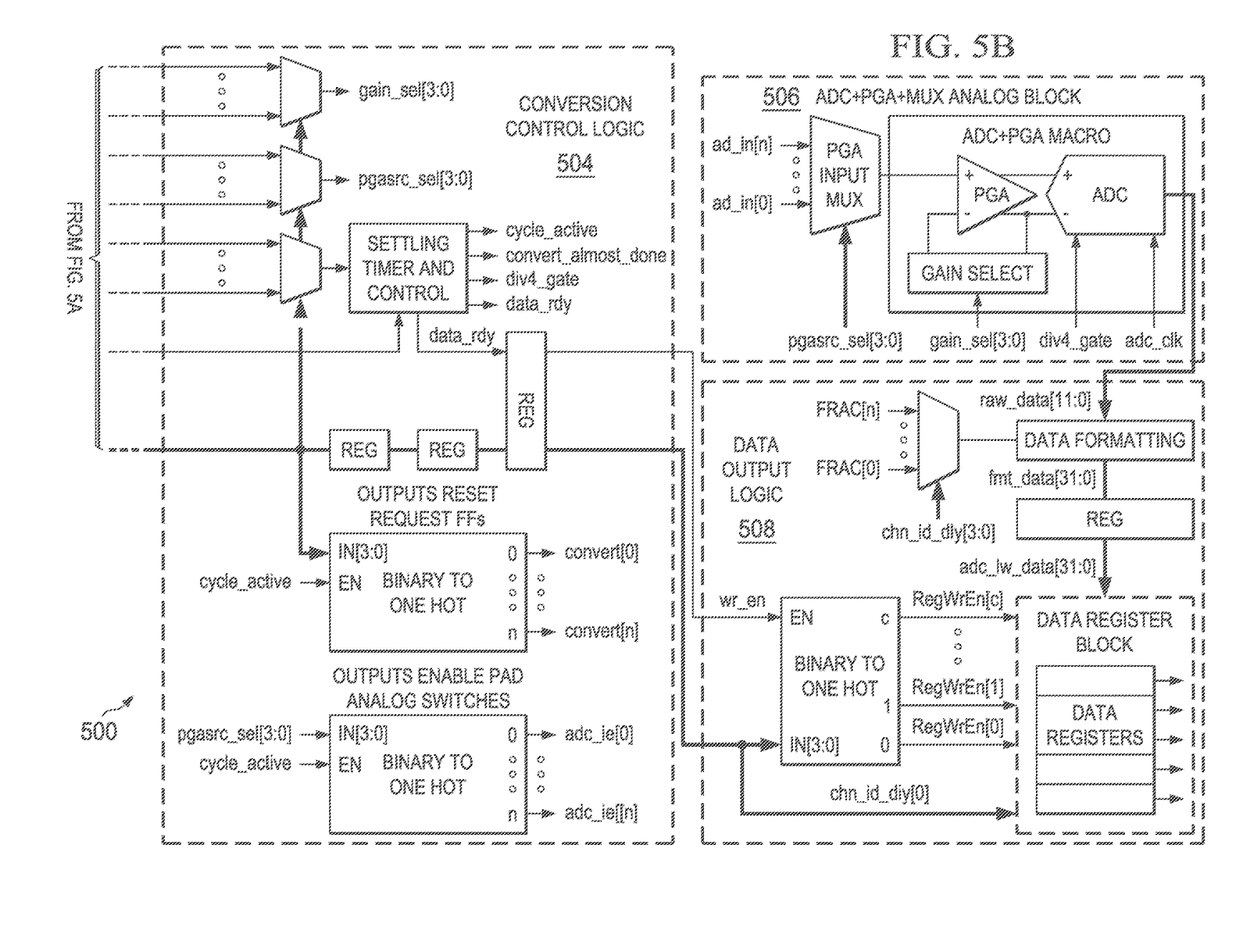

FIGS. 5A-5B are a more detailed exemplary block diagram of an ADC 500 with temporal separation, according to embodiments of the present disclosure. ADC 500 may implement aspects of ADC 400. ADC 500 may include conversion request logic 502, conversion control logic 504, data output logic 508, and an analog block 506 implementing ADC, programmable gain amplifier (PGA), and multiplexing (MUX).

As discussed above, input stages of ADC 500 may be organized in a similar manner to an interrupt controller. Like an interrupt controller, there may be a FF associated with each data channel. Each data channel may specify the signal source for its conversion trigger signal. A multiplexer on the input of each request FF selects the desired conversion request trigger signal. When a request is made (conversion trigger), the associated request FF is set. The outputs of the request FFs are fed into a priority encoder to determine which request should be handled next.

Conversion request logic 502 may include the conversion request FFs, a meta-stability interface, holding register, and the request priority encoder. Priorities may be selected via a fixed scheme. Given an example of sixteen data channels (ADATA0 . . . ADATA15), the ADATA0 data channel may have the highest while ADATA15 may have the lowest priority. The priority encoder mat select the highest priority pending request and generate an ID bit field that represents the number of the associated data channel. After the ADC core circuit has sampled the analog input signal and starts the conversion process, the associated request FF may be cleared.

The FFs may capture the short duration request pulses (triggers) that are generated from a variety of peripherals. The FFs may be implemented as edge sensitive trigger request flip-flops. These may be asynchronously set and synchronously cleared. The peripherals generating the trigger signals may operate at clock frequencies that are different than the ADC clock frequency. The outputs of the FFs may be passed through a meta-stability register and a holding register. Once the highest priority conversion request has been detected and selected, the holding register may prevent any further changes in the conversion request priority selection status until the current conversion cycle has progressed far enough for the next conversion cycle to begin.

As discussed above, the request priority encoder circuit may be configured to monitor all of the pending conversion requests. If there is more than one data channel conversion request is pending, the request priority encoder circuit selects the highest priority input. The output may include a 4-bit value that represents the identifier for the data channel selected for conversion. Additionally, a signal named "convert_req" is outputted to indicate that a conversion has been requested.

The multiplexers shown in the top of conversion control logic 504 may select the gain, signal source and settling time values from the appropriate ACCRx register based on the channel identifier generated by the request priority encoder circuit. Registers such as input selection registers and trigger selection registers in the digital channels may store such information to be routed to the multiplexers and other selection logic of conversion request logic 502 and conversion control logic 504.

Conversion control logic 504 may also include one or more convert one-hot decoder circuits. Such a circuit may uniquely decode which data channel is in the conversion process. The output signal, convert[n:0], may clear the conversion request FF which is associated with the data channel currently in conversion. The clear request FF decoder might only be enabled when cycle_active=1. The circuit may monitor all the pending conversion requests. The decoder circuit may decode PGASRC_SEL[x][3:0] bit fields. The outputs of the decoder circuit may enable the appropriate analog pad switch so that the desired analog signal reaches the PGA multiplexer.

Conversion control logic 504 may also include a settling time and control logic block. This circuitry may be configured to handle initiating and timing the ADC conversion process. The ADC conversion start signal "div4_gate" may be timed on the falling edge of an ADC clock signal (adc_clk). Other circuitry in the ADC controller module may use rising edges of the ADC uses rising edges of adc_clk. The settling time and control logic block may enable a period of time when a new conversion request has been received and prioritized, but it is still waiting for the ADC to finish a pre-existing conversion process. During this time, the appropriate analog pad switch is enabled, and the PGA input mux selection is applied. Thus, the circuit provide additional PGA signal acquisition tasks and settling time. This analog signal selection process can operate while an existing conversion process is still active after the existing conversion process has completed the sampling stage. A new sample and conversion cycle may be accepted and started when convert_req=1 and cycle_active=0. Once a new cycle is started, the PGA settling timer may be initiated.

Data output logic 508 may include a data formatter, data registers, comparators, oversampling filters, and a FIFO. Data logic output logic 508 may operate independently of conversion control logic 504. Once a "data_rdy" signal is registered from the settling timer and control and passed to the data output logic 508 as the data output block as the "wr_en" signal, and the chnl_id[3:0] signals are registered as the "chnl_id_dly[3:0]" signals, data output logic 508 may subsequently operate independently. Data output logic 508 may include a one clock delay for the ADATAx registers, comparators, and FIFO. Data output logic 508 may, for example, stretch 12-bit wide data into 16-bit wide results used for FIFO, or 32-bit wide data for storage into a 32-bit register. This may save software the task of formatting the ADC results for further calculations. The formatted data may be stored into the appropriate data register (ADATA0-ADATA15) as specified by the chnl_id[3:0] signals if the "wr_en" signal is asserted. The valid data is always stored in the data registers even if the data is also to be stored in the optional FIFO.

Although particular embodiments have been illustrated in the present disclosure, additions, modifications, subtractions, and other alterations may be made to the example embodiments of the present disclosure without departing from the spirit and teachings of the present disclosure.

The invention claimed is:

1. A microcontroller comprising:
an analog-to-digital conversion (ADC) circuit including a plurality of channel register sets;
a conversion request flip-flop;
a priority encoder circuit;
a controller circuit configured to:
receive a conversion request signal;
latch the conversion request signal into the conversion request flip-flop;
determine by the priority encoder circuit a highest priority pending conversion request; and
output an active channel identifier code, wherein the channel identifier code is configured to select which of the plurality of data channel register sets is active by identifying received analog selection bits; and
control logic configured to store a converted value from a selected analog input to a data output register based on the channel identifier code;
wherein:
the controller circuit is further configured to cause subsequent measurements from the selected analog input; and
the control logic is further configured to store the subsequent measurements into a plurality of channel registers.

2. The microcontroller according to claim 1, wherein the controller circuit includes a state machine.

3. The microcontroller according to claim 1, wherein the conversion request flip-flop is configured to be cleared as the conversion process is completed.

4. A microcontroller comprising:
an analog-to-digital conversion (ADC) circuit including a plurality of channel register sets;
a conversion request flip-flop;
a priority encoder circuit;
a controller circuit configured to:
receive a conversion request signal;
latch the conversion request signal into the conversion request flip-flop;
determine by the priority encoder circuit a highest priority pending conversion request; and
output an active channel identifier code, wherein the channel identifier code is configured to select which of the plurality of data channel register sets is active by identifying received analog selection bits;
control logic configured to store a converted value from a selected analog input to a data output register based on the channel identifier code; and
a plurality of connection pins, a timer, and a pulsed-width-modulation (PWM) module, wherein the conversion request signal is generated by one of the timer, the PWM module, or the device pin.

5. The microcontroller according to claim 1, wherein the selected analog input is selected from a plurality of analog inputs applied to an analog input multiplexer.

6. The microcontroller according to claim 1, wherein:
the microcontroller further comprises an interrupt handler circuit configured to generate an interrupt to software after the subsequent measurements are stored in the plurality of channel registers.

7. An analog-to-digital converter (ADC), comprising:
a plurality of channel register sets;
a conversion request flip-flop;
a priority encoder circuit;
a controller circuit configured to:
receive a conversion request signal;
latch the conversion request signal into the conversion request flip-flop;
determine by the priority encoder circuit a highest priority pending conversion request; and
output an active channel identifier code, wherein the channel identifier code is configured to select which of the plurality of data channel register sets is active by identifying received analog selection bits; and
control logic configured to store a converted value from a selected analog input to a data output register based on the channel identifier code;
wherein:
the controller circuit is further configured to cause subsequent measurements from the selected analog input; and
the control logic is further configured to store the subsequent measurements into a plurality of channel registers.

8. The ADC according to claim 7, wherein the controller circuit includes a state machine.

9. The ADC according to claim 7, wherein the conversion request flip-flop is configured to be cleared as the conversion process is completed.

10. An analog-to-digital converter (ADC), comprising:
a plurality of channel register sets;
a conversion request flip-flop;
a priority encoder circuit;
a controller circuit configured to:
receive a conversion request signal;
latch the conversion request signal into the conversion request flip-flop;
determine by the priority encoder circuit a highest priority pending conversion request; and
output an active channel identifier code, wherein the channel identifier code is configured to select which of the plurality of data channel register sets is active by identifying received analog selection bits; and
control logic configured to store a converted value from a selected analog input to a data output register based on the channel identifier code; and
a plurality of connection pins, a timer, and a pulsed-width-modulation (PWM) module, wherein the conversion request signal is generated by one of the timer, the PWM module, or the device pin.

11. The ADC according to claim 7, wherein the selected analog input is selected from a plurality of analog inputs applied to an analog input multiplexer.

12. The ADC according to claim 7, wherein:
the ADC further comprises an interrupt handler circuit configured to generate an interrupt to software after the subsequent measurements are stored in the plurality of channel registers.

13. A method for an automated analog-digital-conversion within a microcontroller by an analog-to-digital conversion circuit comprising a plurality of channel register sets, the method comprising the steps of:
receiving a conversion request signal and latching the conversion request signal into a conversion request flip-flop;
receiving a plurality of analog selection bits;
determining by a priority encoder circuit a highest priority pending conversion request;
outputting an active channel identifier code, wherein the channel identifier code is configured to select which of a plurality of data channel register sets is active from a plurality of analog selection bits;

forwarding analog selection bits to an analog input multiplexer;

storing a converted value from a selected analog input to a data output register associated with the channel identifier code;

causing subsequent measurements from the selected analog input; and storing the subsequent measurements into a plurality of channel registers.

14. The method according to claim 13, further comprising clearing the conversion request flip-flop as the conversion process is completed.

15. A method for an automated analog-digital-conversion within a microcontroller by an analog-to-digital conversion circuit comprising a plurality of channel register sets, the method comprising the steps of:

receiving a conversion request signal and latching the conversion request signal into a conversion request flip-flop;

receiving a plurality of analog selection bits;

determining by a priority encoder circuit a highest priority pending conversion request;

outputting an active channel identifier code, wherein the channel identifier code is configured to select which of a plurality of data channel register sets is active from a plurality of analog selection bits;

forwarding analog selection bits to an analog input multiplexer; and storing a converted value from a selected analog input to a data output register associated with the channel identifier code;

wherein the conversion request signal is generated by a timer, PWM module, or device pin as selected by a setting in a conversion request signal selection register.

16. The method according to claim 13, further comprising selecting the analog input from a plurality of analog inputs applied to an analog input multiplexer.

17. The method according to claim 13, further comprising:

generating an interrupt to software after the subsequent measurements are stored in the plurality of channel registers.

* * * * *